US006770942B2

(12) United States Patent
Iinuma (10) Patent No.: US 6,770,942 B2
(45) Date of Patent: Aug. 3, 2004

(54) SEMICONDUCTOR DEVICE HAVING SILICIDE FILM FORMED IN A PART OF SOURCE-DRAIN DIFFUSION LAYERS AND METHOD OF MANUFACTURING THE SAME

(75) Inventor: Toshihiko Iinuma, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/299,700

(22) Filed: Nov. 20, 2002

(65) Prior Publication Data

US 2004/0007745 A1 Jan. 15, 2004

(30) Foreign Application Priority Data

Jul. 10, 2002 (JP) ........................................ 2002-201127

(51) Int. Cl.$^7$ ............................................. H01L 29/76
(52) U.S. Cl. ........................ 257/382; 257/382; 257/384
(58) Field of Search ................................. 257/377, 382, 257/384, 388, 412, 413, 455, 456; 438/424

(56) References Cited

U.S. PATENT DOCUMENTS 5,989,988 A   11/1999  Iinuma et al.
6,323,103 B1 * 11/2001  Rengarajan et al. ........ 438/424
6,388,296 B1 *  5/2002  Hsu ............................. 257/377

FOREIGN PATENT DOCUMENTS

JP        2001-189451        7/2001

* cited by examiner

Primary Examiner—David Nelms
Assistant Examiner—Thinh T Nguyen
(74) Attorney, Agent, or Firm—Finnegan, Henderson, Farabow, Garrett & Dunner, L.L.P.

(57) ABSTRACT

A semiconductor device includes an element separating insulating film provided on a semiconductor substrate to separate an element region. A gate electrode is arranged above the element region. Source/drain regions are formed in the semiconductor substrate to sandwich a region below the gate electrode. A silicide film is provided on the source/drain regions, extending onto the element separating insulating film. A contact hole extends through the interlayer insulating film, which is provided on the element separating insulating film and the silicide film, and reaches the silicide film. Ends of the contact hole are positioned on the silicide film and on the element separating insulating film. The contact hole includes a trench portion whose one end contacts with the edge of the silicide film in the bottom of the contact hole and in an upper portion of the element separating insulating film. A wiring layer is arranged in the contact hole.

13 Claims, 5 Drawing Sheets

SEMICONDUCTOR DEVICE HAVING SILICIDE FILM FORMED IN A PART OF SOURCE-DRAIN DIFFUSION LAYERS AND METHOD OF MANUFACTURING THE SAME

CROSS-REFERENCE TO RELATED APPLICATIONS

This application is based upon and claims the benefit of priority from the prior Japanese Patent Application No. 2002-201127, filed Jul. 10, 2002, the entire contents of which are incorporated herein by reference.

BACKGROUND OF THE INVENTION

1. Field of the Invention

The present invention relates to a semiconductor device, particularly, to a MIS (Metal Insulator Semiconductor) type FET (Field Effect Transistor) device having a silicide film formed in a part of the source/drain diffusion layers.

2. Description of the Related Art

In a semiconductor device comprising a transistor such as an MIS (including MOS (Metal Oxide Semiconductor)) type FET, so called a border-less contact technology may be adopted. The technology does not provide an allowance between the transistor region in which a transistor is formed and the contact region in which a contact is formed in order to avoid an inconvenience caused by a deviation of a mask pattern.

Figure 9:
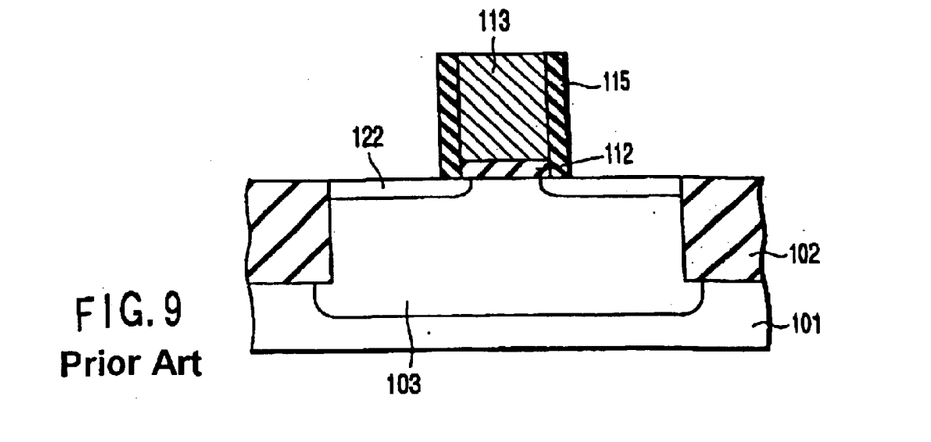
FIGS. 9, 10, 11 and 12 are cross sectional views collectively showing schematically the conventional manufacturing process of a semiconductor device.

FIGS. 9 to 12 collectively show the conventional manufacturing process of a transistor by using the border-less contact. As shown in FIG. 9, an element separating insulating film 102 and a well diffusion layer 103 are formed in the surface region of semiconductor substrate 101, followed by forming a gate insulating film 112, a gate electrode 113 and a first side wall insulating film 115. Then, a second diffusion region 122 is formed in a surface region of the well diffusion layer 103.

Figure 10:
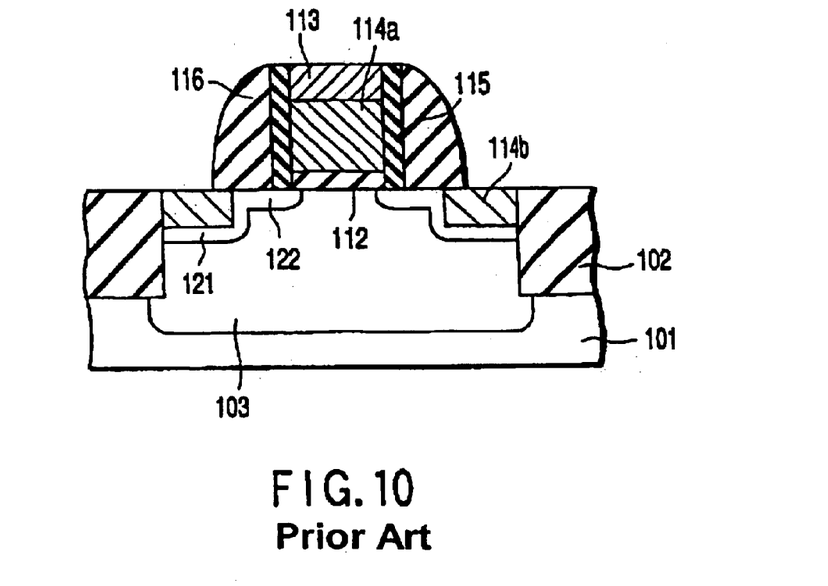

Then, as shown in FIG. 10, a second side wall insulating film 116 and a first diffusion region 121 are formed. Then, silicide films 114a, 114b are formed.

Figure 11:
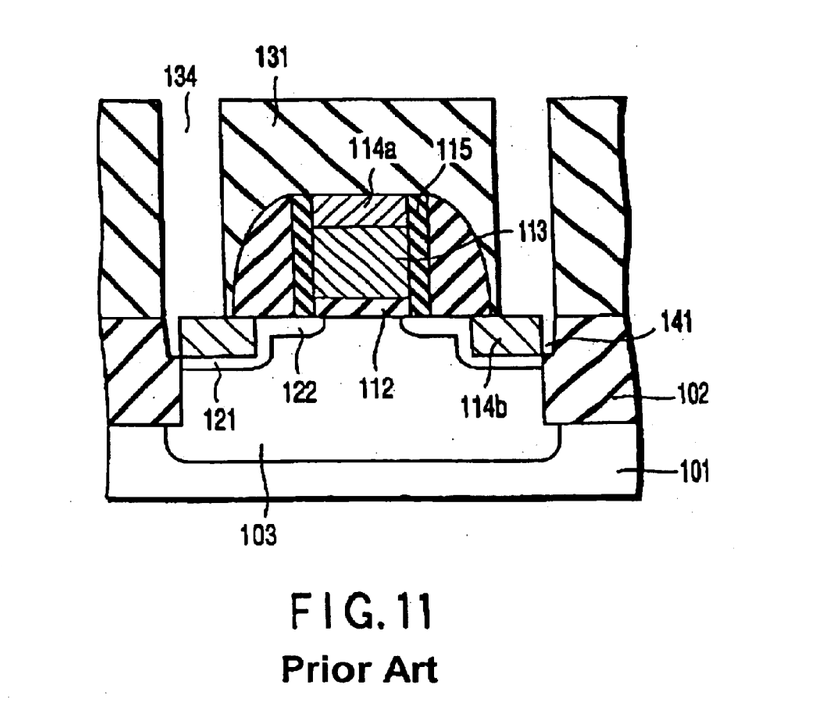

Then, as shown in FIG. 11, an interlayer insulating film 131 is formed, followed by forming a contact hole 134 in the interlayer insulating film 131 by an anisotropic etching such as RIE (Reactive Ion Etching) using a mask having an opening in the position corresponding to the contact hole 134.

Figure 12:
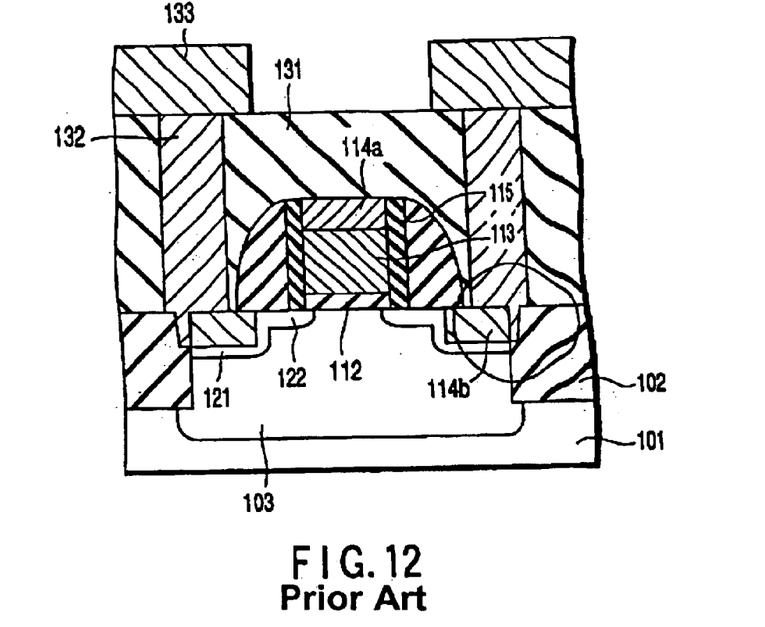

Then, as shown in FIG. 12, the contact hole 134 is filled with a tungsten film 132 with the laminate structure (not shown) interposed therebetween.

In the lithography process, a mask position may be deviated, causing the opening of the mask for the contact hole 134 to sit on the element separating insulating film 102. Therefore, as shown in FIG. 11, a trench 141 may be formed in the element separating insulating film 102 in forming the contact hole 134.

Figure 13:
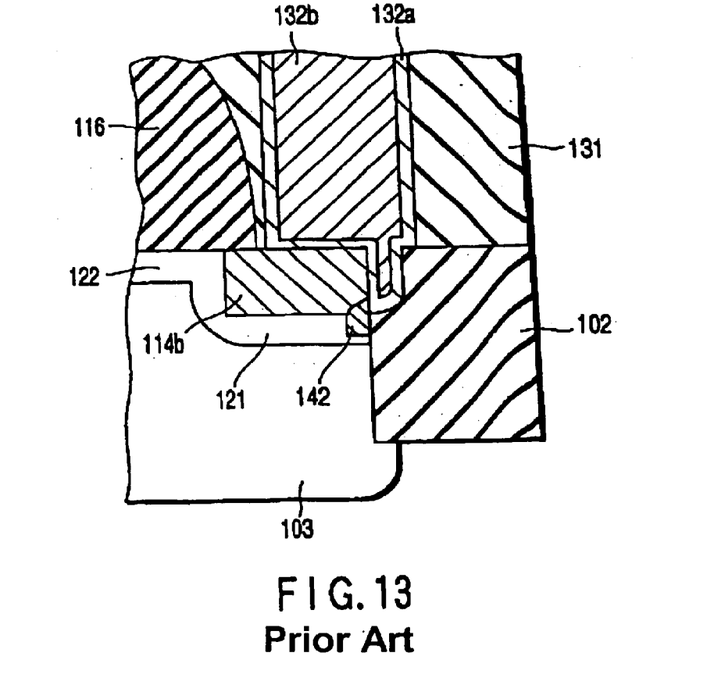
FIG. 13 is a cross sectional view showing in a magnified fashion a part of FIG. 12.

FIG. 13 shows in a magnified fashion the region surrounded by a circle of the solid line in FIG. 12. As shown in FIG. 13, if the trench 141 is formed, the contact 132a, 132b are also formed in the trench 141 when filling the contact hole 134. If the trench 141 is deep enough to reach the junction between the first diffusion region 121 and the well diffusion layer 103, a short circuit is brought about in the junction.

Also, even when the trench 141 is not seriously deep, the trench 141 may reach the side surface of the first diffusion region 121, as shown in FIG. 13, causing a silicide layer 142 to form. As a result, a leak current flowing through the silicide layer 142 increases between the first diffusion region 121 and the well diffusion layer 103.

It also should be noted that the first diffusion region 121 is rendered shallower as the semiconductor device shrinks, which makes the distance between the bottom of the silicide film 114b and the junction between the first diffusion region 121 and the well diffusion layer 103 decrease. Even if the silicide layer 142 is not formed, the junction leak current from the silicide film 114b increases.

It should be noted that due to, e.g. the etching conditions, these problems are not generated uniformly, which lowers the yield of the semiconductor device.

Further, if the gate length is rendered 100 nm or less, simply lowering the accelerating energy in the ion implantation process to form the second diffusion layer 122 greatly rises the sheet resistance of this region, which makes the driving capability of the transistor deteriorate. The dose, i.e. the number of impurity atoms to be implanted, can be increased to avoid the problem. However, this solution scarcely increases the amount of the impurity atoms that are actually activated within silicon, and does not overcome the problem. In addition, the deeper the second diffusion region 122 reaches, the more device characteristics deteriorate. Particularly, the short channel effect occurs.

The formation of the trench 141 may be avoided by controlling, for example, the etching time for forming the contact hole 134. However, it is difficult to avoid the problem for each element separating insulating film 102, due to the controllability of the etching.

It is also conceivable to form a liner material layer such that the liner material layer extends from above the element separating insulating film 102 onto the silicide layer 114a. However, it is impossible to ensure a sufficiently large etching selectivity between the materials generally used for the insulating films 131, 102 and the liner material to overcome the problem.

Incidentally, in a conventional NMOS device, the aforementioned problems in a PMOS are also generated.

BRIEF SUMMARY OF THE INVENTION

According to a first aspect of the present invention, there is provided a semiconductor device comprising: a semiconductor substrate; an element separating insulating film provided in a surface region of the semiconductor substrate, the element separating insulating film separating element region; a gate electrode provided on the element region of the semiconductor substrate with a gate insulating film interposed therebetween; a pair of source/drain regions formed in a surface region of the semiconductor substrate in a manner to sandwich a region below the gate electrode; a silicide film provided on the surfaces of the source/drain regions such that the silicide film extends onto the element separating insulating film, the silicide film having an upper surface positioned above the surface of the semiconductor substrate; an interlayer insulating film provided on the element separating insulating film and the silicide film; a contact hole extending through the interlayer insulating film to reach the silicide film, having one end and the other end positioned on the silicide film and on the element separating insulating film, respectively, and having a trench portion formed in the bottom portion of the contact hole and in the upper portion of the element separating insulating film, the trench portion having one end being in contact with an edge of the silicide film; and a wiring layer provided in the contact hole.

According to a second aspect of the present invention, there is provided a method of manufacturing a semiconductor device comprising: forming an element separating insulating film separating the element region in a surface region of a semiconductor substrate; forming a pair of source/drain regions in a surface region of the element region of the semiconductor substrate; forming a gate structure including a gate insulating film and a gate electrode on that region of the semiconductor substrate which is positioned between the source/drain regions; forming a silicide film extending from a part of the source/drain regions onto the element separating insulating film; forming an interlayer insulating film on the element separating insulating film and the silicide film; selectively etching the interlayer insulating film so as to form a contact hole and a trench portion, the bottom of the contact hole being in contact with the silicide film and the contact hole having one end and the other end positioned on the silicide film and on the element separating insulating film, respectively, and the trench portion having one end being contact with an edge of the silicide film in an upper portion of the element separating insulating film; and filling the contact hole with a conductive film.

DETAILED DESCRIPTION OF THE INVENTION

One embodiment of the present invention will now be described with reference to the accompanying drawings. Incidentally, in the following description, the constituting elements having substantially the same function and the same construction are denoted by the same reference numerals so as to avoid an overlapping description as much as possible.

Figure 1:
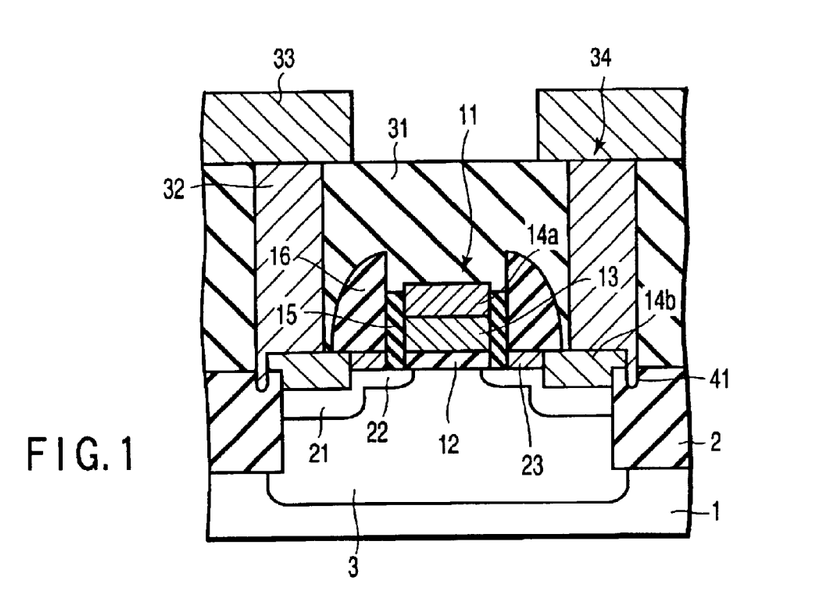
FIG. 1 is a cross sectional view schematically showing the construction of a semiconductor device according to one embodiment of the present invention.

FIG. 1 is a cross sectional view schematically showing the construction of a semiconductor device according to one embodiment of the present invention. Incidentally, the following description is directed to a P-type MIS transistor. However, an N-type transistor can also be manufactured similarly by changing appropriately the conductivity type of the impurity.

As shown in FIG. 1, a plurality of element separating insulating films 2 are formed in a surface region of, for example, an N-type semiconductor substrate 1. The semiconductor substrate 1 is formed of, for example, silicon. The element regions are separated from each other by the element separating insulating film 2. The element separating insulating film 2 is formed of, for example, a silicon oxide film and has a trench portion 41 in an upper surface region. The trench portion 41 will be described in detain herein later.

An N-type well diffusion layer 3 is formed in the surface region of the element region included in the semiconductor substrate 1, and an MIS transistor 11 is formed on the well diffusion layer 3. The transistor 11 includes a gate insulating film 12, a gate electrode 13, silicide films 14a, 14b, a first side wall insulating film 15, a second side wall insulating film 16, a first diffusion layer 21 and a second diffusion layer 22.

The gate electrode 13 is formed above the well diffusion layer 3 with the gate insulating film 12 interposed therebetween. The gate insulating film 12 is formed of, for example, a silicon oxide film, and the gate electrode 13 is formed of, for example, a polycrystalline silicon (polysilicon). The silicide film 14a is formed on the upper surface of the gate electrode 13. The silicide film 14a is formed of, for example, cobalt silicide ($CoSi_2$). The upper surface of the silicide film 14b is positioned above the surface of the semiconductor substrate 1.

The side surfaces of the gate insulating film 12, the gate electrode 13 and the silicide film 14a are covered with the first side wall insulating film 15. The first side wall insulating film 15 is formed of, for example, a silicon nitride film. Further, a second side wall insulating film 16 is formed to cover the surface of the first side wall insulating film 15. The second side wall insulating film 16 is formed of, for example, a silicon oxide film.

The P-type first diffusion region (source/drain contact region) 21 is formed on the surface of the well diffusion layer 3 in a manner to extend from, for example, the element separating insulating film 2 to reach a region in the vicinity of the first side wall insulating film 15. Also, the P-type second diffusion region (source/drain extension region) 22 is formed on the surface of the well diffusion layer 3. The second diffusion region 22 is formed to extend from, for example, the edge portion of the first diffusion region 21 to the edge portion of the gate electrode 13 and is formed shallower than the first diffusion region 21. Also, the second diffusion layer 22 has an impurity concentration lower than that of the first diffusion region 21.

A silicon film 23 is formed on the surface of the first and second diffusion region 21, 22. The silicon film 23 is positioned between the semiconductor substrate 1 and the second side wall insulating film 16 and extends from, for example, the edge portion of the first side wall insulating film 15 to a region in the vicinity of the second side wall insulating film 16.

The silicide film 14b is formed on the surface of the first diffusion region 21. The silicide film 14b extends onto the element separating insulating film 2 so as to extend from the edge portion of the trench portion 41 to reach the edge portion of the silicon film 23. Further, the silicide film 14b is formed of cobalt silicide like the silicide film 14a.

An interlayer insulating film 31 is formed on the entire surface of the semiconductor substrate 1. The interlayer insulating film 31 is formed of, for example, a silicon oxide film. A contact hole 34 is formed in the interlayer insulating film 31. The contact hole 34 reaches the silicide film 14b. One end of the contact hole 34 is positioned on the silicide film 14b, and the other end of the contact hole 34 is positioned on the element separating insulating film 2. The contact hole 34 communicates with the trench portion 41.

A conductive film made of, for example, aluminum or copper is formed inside the contact hole 34, thereby forming a contact 32. The conductive film is also formed within the trench portion 41. Further, a wiring layer 33 connected to the contact 32 is formed on the interlayer insulating film 31.

One end of the trench portion 41 is in contact with the edge of the silicide film 14b, and the other end of the trench portion 41 is common with the other end of the contact hole 34. Also, the trench portion 41 is formed in a position a prescribed distance apart from the edge of the element separating insulating film 2. In other words, the element separating insulating film 2 is interposed between the trench portion 41 and the edge portion of the first diffusion region 21.

The distance between the edge of the trench portion 41 and the edge of the element separating insulating film 2 can be set at, for example, 5 nm to 50 nm, preferably at 10 nm to 30 nm. The distance noted above can be set at 20 nm in the case where, for example, the design rule of the element is 100 nm, the gate length of the gate electrode 13 is 40 nm, and the thickness of the silicide film 14b is 30 nm. Where the distance between the edge portion of the trench portion 41 and the edge portion of the element separating insulating film 2 is set at 20 nm as described above, it is possible to obtain desired effects as described herein later. Incidentally, the distance between the edge of the trench portion 41 and the edge of the element separating insulating film 2 can be set at an optional value by the method described herein later.

The manufacturing method of the semiconductor device of the construction described above will now be described. FIGS. 2 to 7 are cross sectional views collectively showing the manufacturing process of the semiconductor device constructed as shown in FIG. 1.

Figure 2:
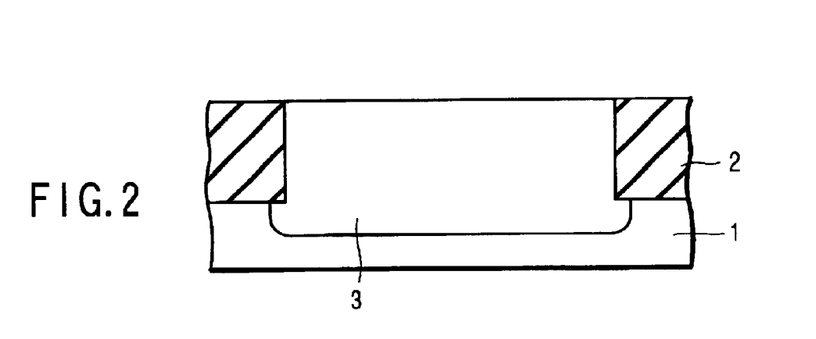
FIGS. 2, 3, 4, 5, 6, 7 and 8 are cross sectional views collectively showing schematically the manufacturing process of the semiconductor device shown in FIG. 1.

In the first step, a trench is formed in a surface region of a semiconductor substrate 1 by employing the photolithography process and an etching technology, as shown in FIG. 2. An anisotropic etching such as RIE is employed as the etching technology. Then, an insulating film such as a silicon oxide film is buried inside the trench so as to form an element separating insulating film 2, followed by introducing an N-type impurity into the surface region of the semiconductor substrate 1 by means of an ion implantation. Phosphorus, for example, may be used as the N-type impurity. Further, the semiconductor substrate 1 is subjected to a heat treatment so as to diffuse the impurity, thereby forming a well diffusion layer 3.

Figure 3:
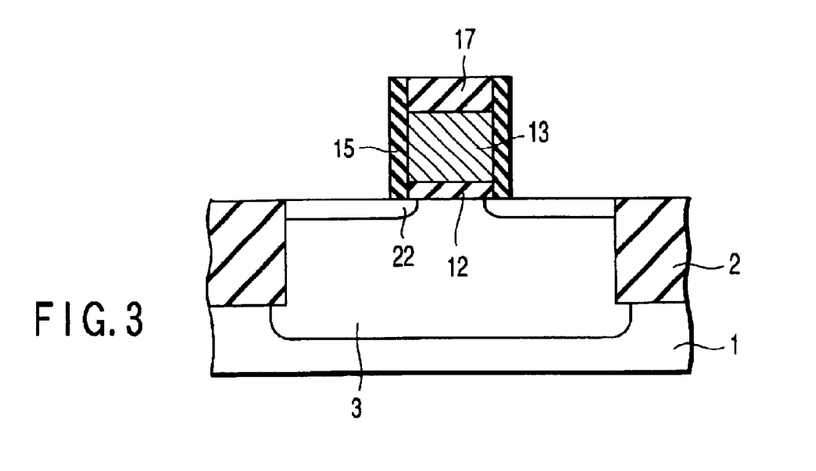

In the next step, a gate insulating film material layer is formed on the exposed surface of the semiconductor substrate 1 (well diffusion layer 3), as shown in FIG. 3. The gate insulating film material layer can be formed by, for example, a thermal oxidation. Then, a polysilicon material layer and a silicon nitride film material layer are deposited successively on the gate insulating film material layer, followed by etching the silicon nitride film material layer, the polysilicon material layer and the gate insulating film material layer by the lithography process and the etching technology, thereby forming a gate structure consisting of a gate insulating film 12, a gate electrode 13, and a silicon nitride film 17.

Then, an insulating film such as a silicon nitride film is deposited on the entire surface of the semiconductor substrate 1 by, for example, a CVD (Chemical Vapor Deposition) method, followed by etching the insulating film by an etching technology such as RIE. As a result, a first side insulating film 15 is formed. Then, a P-type impurity is implanted by an ion implantation method into the surface region of the semiconductor substrate 1 by using the silicon nitride film 17 and the first side wall insulating film 15 as a mask. Boron (B) or boron fluoride ($BF_2$), for example, can be used as the P-type impurity. The ion implantation is carried out under the condition of a low accelerating energy. Where, for example, boron is used as the impurity, the accelerating energy should be not higher than about 500 eV. In the case of using boron fluoride as the impurity, the accelerating energy should be not higher than about 5 keV. As a result of the ion implantation, a second diffusion region 22 is formed.

Figure 4:
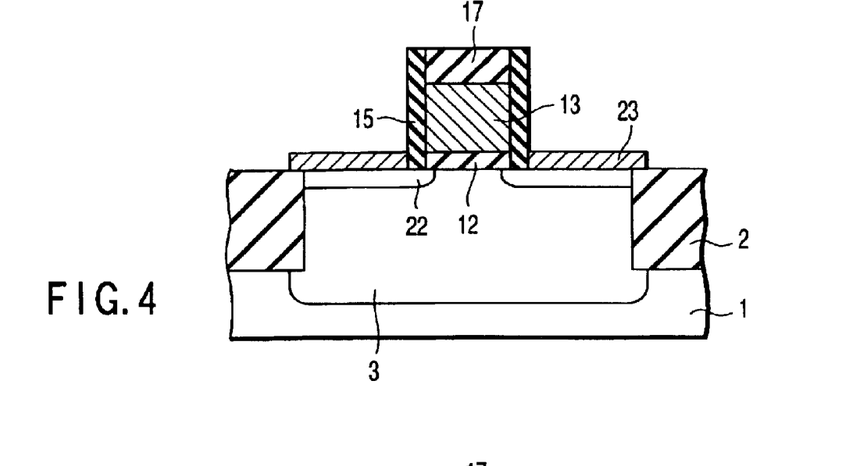

Then, a silicon film 23 is formed by the selective growth on the surface of the second diffusion region 22, as shown in FIG. 4. The silicon film 23 extends from the first side wall insulating film 15 onto a part of the element separating insulating film 2. The silicon film 23 can be formed by, for example, depositing an amorphous silicon under the condition of a low temperature, followed by crystallizing the amorphous silicon film by a heat treatment at about 600° C. In this case, the amorphous silicon film other than the crystallized region can be selectively removed by an etching treatment such as a dry chemical etching. The method of selectively forming a single crystalline silicon film by the particular process described above is proposed in, for example, Japanese Patent Application No. 11-375404.

The thickness of the silicon film and the protruding amount of the silicon film onto the element separating insulating film 2 can be set optionally by controlling, for example, the thickness of the amorphous silicon film, and the temperature and time for the crystallizing heat treatment. By the particular control, the formation of the silicon film 23 can be made optimum in accordance with the semiconductor device to which the embodiment of the present invention is applied. For example, where the design rule of the device is 100 nm, the gate length is 40 nm, and the thickness of the silicide film is 30 nm, it is advisable to set the thickness of the silicon film 23 at about 20 nm. As a result, it is possible to set the length of the silicon film 23 extruding onto the element separating insulating film 2 at about 20 nm. In the subsequent step, the extruding silicon film 23 is converted into a silicide film, and a trench portion 41 is formed by using the silicide film thus formed as a mask. As a result, it is possible to set the distance between the edge of the trench portion 41 and the edge of the element separating insulating film 2 at 20 nm.

The advantages described below can be obtained by employing the method proposed in Japanese Patent Application No. 11-375404 referred to above. First of all, it should be noted that, for selectively growing a single crystalline silicon film by the CVD method, it is necessary to subject the silicon surface to a cleaning treatment under the condition of a high temperature not lower than 900° C. By the heat treatment under a high temperature, the impurity implanted into the second diffusion region 22 with a low accelerating energy is diffused. As a result, the bottom of the second diffusion region 22 is formed in a position deeper than desired. However, the method proposed in the Japanese Patent document referred to above makes it unnecessary to apply the heat treatment under a high temperature so as to avoid the particular problem. It is also possible to prevent the implanted boron from being lost by the outward diffusion.

Figure 5:
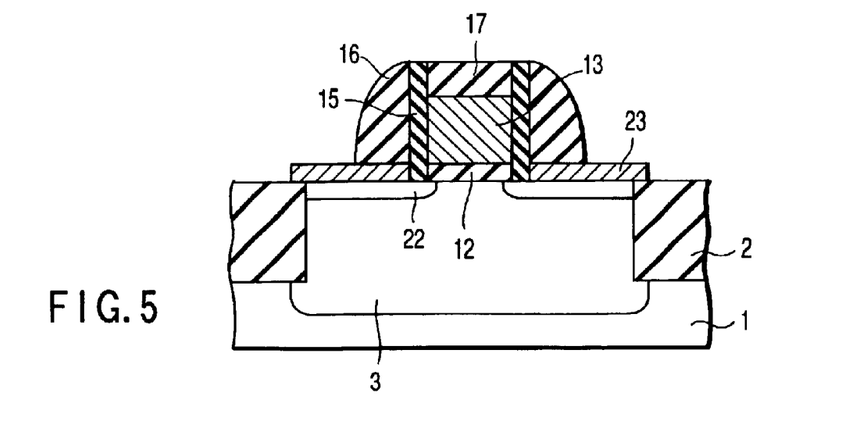

Then, an insulating film such as a silicon oxide film is deposited on the entire surface of the semiconductor substrate 1 by, for example, a CVD method, as shown in FIG. 5, followed by etching the insulating film so as to form a second side wall insulating film 16.

Figure 6:
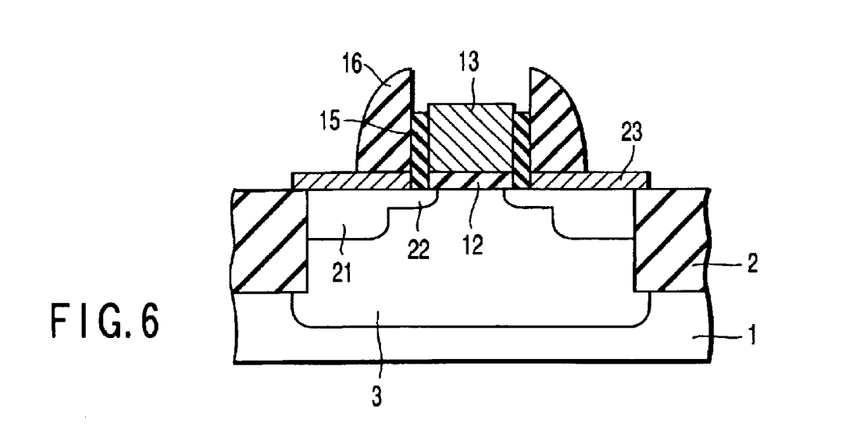

Then, the silicon nitride film 17 is removed by using, for example, a heated phosphoric acid, as shown in FIG. 6, followed by implanting a P-type impurity into a surface region of the semiconductor substrate 1 by using the second side wall insulating film 16 as a mask. Boron, for example, may be used as the P-type impurity. Then, the semiconductor substrate 1 is subjected to a heat treatment under the condition of, for example, about 1,050° C. for a very short time. As a result, a first diffusion region 21 is formed and, at the same time, the gate electrode 13 is allowed to have a P-type conductivity. Also, the P-type impurity in the surface region of the second diffusion region 22 is thermally diffused simultaneously into a region of the silicon 23 which is positioned in the vicinity of the first side wall insulating film 15. As a result, the particular region of the silicon film 23 is also allowed to exhibit the P-type conductivity.

Figure 7:
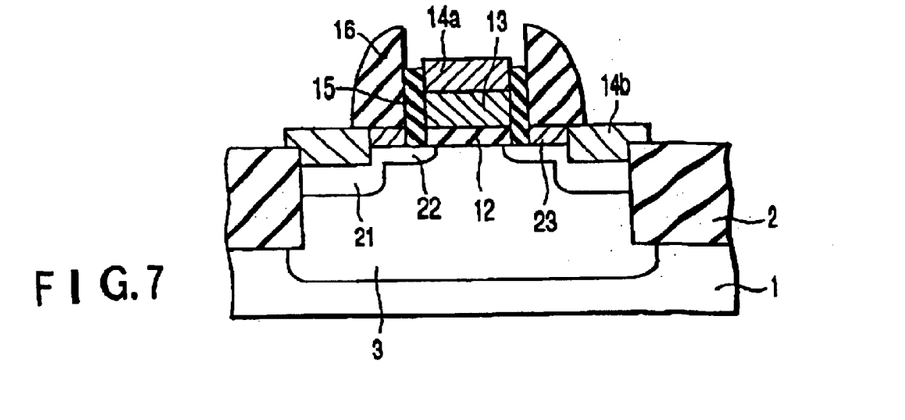

Then, the native oxide film formed on the surfaces of the gate electrode 13 and the silicon film 23 is removed by a wet etching, as shown in FIG. 7. A dilute hydrofluoric acid solution, for example, may be used as the etchant for the wet etching. Then, the surfaces of the silicon film 23 and the semiconductor substrate 1 are partly converted into silicide films by the known salicide process so as to form silicide films 14a, 14b on the surfaces of the gate electrode 13 and the second diffusion region 22, respectively.

Figure 8:
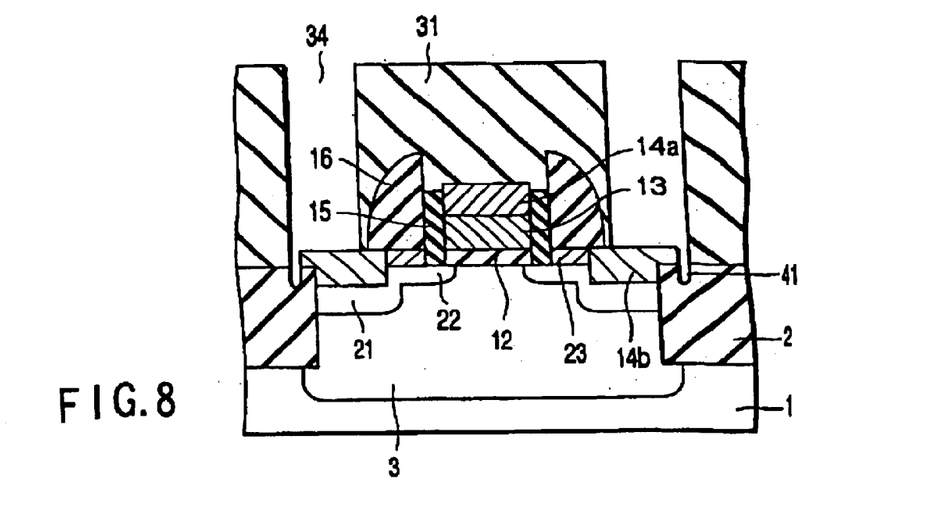

Then, an insulating film such as a silicon oxide film is deposited on the entire surface of the semiconductor substrate 1 by, for example, a CVD method, as shown in FIG. 8, followed by planarizing the surface of the insulating film by, for example, a CMP (Chemical Mechanical Polishing) method, thereby forming an interlayer insulating film 31. Then, a contact hole 34 is formed in the interlayer insulating film 31 by the photolithography process and the anisotropic etching such as RIE.

As described previously in conjunction with the prior art, in forming the contact hole 34, the edge portion of the opening of the mask can be positioned above the element separating insulating film 2. However, since the silicide film 14b extends onto the element separating insulating film 2, the particular portion is not etched and a region of the element separating insulating film 2 without the silicide film 14b is removed. That is, the trench portion 41 is formed in a self-aligned fashion with the silicide film 14b used as a mask.

Further, a contact 32 consisting of a titanium film, a titanium nitride film, and a tungsten film is formed inside the contact hole 34, as shown in FIG. 1. The contact 32 can be formed by, for example, a CVD method or a sputtering method. Where the trench portion 41 is already formed in filling the contact hole 34 with the tungsten film, the tungsten film is also buried in the trench portion 41 as in the contact hole 34. Then, the wiring layer 33 is formed by the known method.

According to the embodiment of the present invention described above, the silicide film 14b extends by a prescribed distance to reach the element separating insulating film 2. Therefore, even if the trench portion 41 is already formed in the element separating insulating film 2 in the step of forming the contact hole 34, it is possible to prevent the trench portion 41 from contact with the first diffusion region 21. It follows that it is possible to prevent the problem inherent in the prior art, i.e., formation of an abnormally grown silicide film 142 shown in FIG. 13. Naturally, it is possible to avoid generation of a junction leak current caused by the silicide film 142.

It should also be noted that the bottom of the silicide film 14b is positioned apart from the junction between the first diffusion region 21 and the well diffusion layer 3 by a distance equal to the thickness of the silicon film 23. Therefore, it is possible to suppress the defect derived from the junction leak current caused by the silicide film.

In recent years, an increase of the parasitic resistance in the source/drain extension region, which is brought about by miniaturizing the semiconductor device, attracts attentions. However, according to the embodiment of the present invention, the P-type silicon film 23 is formed below the second side wall insulating film 16. The particular portion performs the function of a conductive film and serves to allow the drain current to flow. It follows that it is possible to decrease markedly the parasitic resistance, with the result that the driving capability of the transistor can be improved.

It should be noted that the present invention are not limited by the aforementioned embodiment.

Additional advantages and modifications will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate;
   an element separating insulating film provided in a surface region of the semiconductor substrate, the element separating insulating film separating an element region;
   a gate electrode provided on the element region of the semiconductor substrate with a gate insulating film interposed therebetween;
   a pair of source/drain regions formed in a surface region of the semiconductor substrate in a manner to sandwich a region below the gate electrode;
   a silicide film provided on the surfaces of the source/drain regions such that the silicide film extends onto the element separating insulating film, the silicide film having an upper surface positioned above the surface of the semiconductor substrate;
   an interlayer insulating film provided on the element separating insulating film and the silicide film;
   a contact hole extending through the interlayer insulating film to reach the silicide film, having one end and the other end positioned on the silicide film and on the element separating insulating film, respectively, and having a trench portion formed in the bottom portion of the contact hole and in the upper portion of the element separating insulating film, the trench portion having one end being in contact with an edge of the silicide film; and
   a wiring layer provided in the contact hole.

2. The device according to claim 1, wherein the trench portion and the edge of the contact hole have a common edge.

3. The device according to claim 1, wherein the edge of each of the source/drain regions is in contact with the element separating insulating film.

4. The device according to claim 1, wherein a part of the element separating insulating film is interposed between the trench portion and the source/drain regions.

5. The device according to claim 1, wherein a material same as that of the wiring layer is buried in the trench portion.

6. A semiconductor device comprising:
   a semiconductor substrate;
   an element separating insulating film provided in a surface region of the semiconductor substrate, the element separating insulating film separating an element region;
   a gate electrode provided on the element region of the semiconductor substrate with a gate insulating film interposed therebetween;
   a pair of source/drain regions formed in a surface region of the semiconductor substrate in a manner to sandwich a region below the gate electrode;

a silicide film provided on the surfaces of the source/drain regions such that the silicide film extends onto the element separating insulating film, the silicide film having an upper surface positioned above the surface of the semiconductor substrate;

an interlayer insulating film provided on the element separating insulating film and the silicide film;

a contact hole extending through the interlayer insulating film to reach the silicide film, having one end and the other end positioned on the silicide film and on the element separating insulating film, respectively, and having a trench portion formed in the bottom portion of the contact hole and in the upper portion of the element separating insulating film, the trench portion having one end being in contact with an edge of the silicide film;

a wiring layer provided in the contact hole; and a silicon film provided on the surface of the semiconductor substrate in a region between the gate electrode and the silicide film and having a height substantially equal to that of the silicide film.

7. The device according to claim 6, wherein the silicon film is conductive.

8. The device according to claim 6, wherein each of the source/drain regions includes a first diffusion region and a second diffusion region formed in the surface region of the semiconductor substrate in a region positioned below the silicon film, the second diffusion region has an impurity concentration lower than that in the first diffusion region.

9. The device according to claim 1, wherein the distance between the edge of the element separating insulating film and said one end of the trench portion falls within a range of 5 nm and 50 nm.

10. The device according to claim 1, wherein said one end of the trend portion is apart from the edge of the element separating insulating film.

11. The device according to claim 1, wherein a side edge of the trench portion and a side edge of the source/drain regions sandwich a part of the element separating insulating film.

12. The device according to claim 6, wherein said one end of the trend portion is apart from the edge of the element separating insulating film.

13. The device according to claim 6, wherein a side edge of the trench portion and a side edge of the source/drain regions sandwich a part of the element separating insulating film.

* * * * *